US006979654B2

(12) United States Patent
Chang et al.

(10) Patent No.: US 6,979,654 B2
(45) Date of Patent: Dec. 27, 2005

(54) METHOD OF AVOIDING DIELECTRIC LAYER DETERIOATION WITH A LOW DIELECTRIC CONSTANT DURING A STRIPPING PROCESS

(75) Inventors: Ting-Chang Chang, Hsin-Chu (TW); Po-Tsun Liu, Hsin-Chu (TW); Yi-Shien Mor, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 542 days.

(21) Appl. No.: 09/681,986

(22) Filed: Jul. 3, 2001

(65) Prior Publication Data

US 2003/0013311 A1 Jan. 16, 2003

(51) Int. Cl.[7] ................................................ H01L 21/00

(52) U.S. Cl. ........................... 438/723; 216/79; 216/99; 438/743; 438/745; 438/756

(58) Field of Search ................................ 438/723, 743, 438/745, 756; 216/67, 79, 99

(56) References Cited

U.S. PATENT DOCUMENTS 6,165,891 A * 12/2000 Xu et al. ................ 438/692 X

* cited by examiner

*Primary Examiner*—Nadine G. Norton
*Assistant Examiner*—Binh X. Tran
(74) *Attorney, Agent, or Firm*—Winston Hsu

(57) ABSTRACT

A low k dielectric layer is formed on a surface of a substrate of a semiconductor wafer. Then, a surface treatment is performed to the low k dielectric layer to form a passivation layer on a surface of the low k dielectric layer. A patterned photoresist layer is formed over the surface of the semiconductor wafer. The patterned photoresist layer is then used as a hard mask to perform an etching process on the low k dielectric layer. Finally, a stripping process is performed to remove the patterned photoresist layer. The passivation layer is used to prevent deterioration of the dielectric characteristic of the low k dielectric layer during the stripping process.

17 Claims, 8 Drawing Sheets

METHOD OF AVOIDING DIELECTRIC LAYER DETERIOATION WITH A LOW DIELECTRIC CONSTANT DURING A STRIPPING PROCESS

BACKGROUND OF INVENTION

1. Field of the Invention

The present invention provides a method for avoiding deterioration of a dielectric characteristic of a dielectric layer having a low dielectric constant (low k), during a stripping process.

2. Description of the Prior Art

With the decreasing size of semiconductor devices and an increase in integrated circuits (IC) density, RC time delay, produced between the metal wires, seriously affects IC operation performance and reduces IC operating speed. RC time delay effects are more obvious especially when the line width is reduced to 0.25 μm, even 0.13 μm in semiconductor process.

RC time delay produced between metal wires is a product of the electrical resistance (R) of the metal wires and the parasitic capacitance (C) of a dielectric layer between the metal wires. However, there are two approaches to reduce RC time delay: a) using conductive materials with a lower resistance as a metal wire or, b) reducing the parasitic capacitance of the dielectric layer between metal wires. In the approach of using a metal wire with a lower resistance, copper interconnection technology replaces the traditional Al:Cu(0.5%) alloy fabrication process and is a necessary tendency in multilevel metallization processes. Due to copper having a low resistance (1.67 μΩ-cm) and higher current density load without electro-migration in the Al/Cu alloy, the parasitic capacitance between metal wires and connection levels of metal wires is reduced. However, reducing RC time delay produced between metal wires by only copper interconnection technology is not enough. Also, some fabrication problems of copper interconnection technology need to be solved. Therefore, it is more and more important to reduce RC time delay by the approach of reducing the parasitic capacitance of the dielectric layer between metal wires.

Additionally, the parasitic capacitance of a dielectric layer is related to the dielectric constant of the dielectric layer. As the dielectric constant of the dielectric layer is lower, the parasitic capacitance of the dielectric layer is lower. Traditionally silicon dioxide (dielectric constant is 3.9) cannot meet the requirement of 0.13 μm in semiconductor processes, so some new low k materials, such as polyimide (PI), FPI, FLARE™, PAE-2, PAE-3 or LOSP are thereby consecutively proposed.

Unfortunately, the these low k materials are composed of carbon, hydrogen and oxygen and have significantly different properties to those of traditional silicon dioxide used in etching or adhering with other materials. Most of these low k materials have some disadvantages such as poor adhesion and poor thermal stability, so they cannot properly integrate into current IC fabrication processes.

Therefore, another kind of low k dielectric layer, such as HSQ (hydrogen silsesquioxane) (k=2.8), MSQ (methyl silsesquioxane)(k=2.7), HOSP (k=2.5), H-PSSQ (hydrio polysilsesquioxane), M-PSSQ (methyl polysilsesquioxane), P-PSSQ (phenyl polysilsesquioxane) and porous sol-gel, using the silicon dioxide as a base and adding some carbon and hydrogen elements inside is needed. These silicon based low k materials have potential in the future since properties of these materials resemble traditional silicon dioxide and can be easily integrated into the current IC fabrication process.

However, when patterning a dielectric layer composed of silicon dioxide based low k materials, the dielectric layer suffers some damages during an etching or stripping process. Since the stripping process usually uses dry oxygen plasma ashing and wet stripper to remove a photoresist layer, the bonds in a surface of the dielectric layer are easily broken by oxygen plasma bombardment and react with oxygen radical and wet stripper to form Si—OH bonds. Since the Si—OH bonds absorb water moisture and the water dielectric constant is very high (k=78), the dielectric constant and leakage current of the dielectric layer are increased, and even a phenomenon of poison via occurs, thereby seriously affecting the reliability of products.

SUMMARY OF INVENTION

It is therefore a primary objective of the present invention to provide a method for avoiding deterioration of a dielectric characteristic of a dielectric layer having a low dielectric constant during a stripping process, to solve the above-mentioned problems.

In accordance with the claim invention, the method involves first forming a low k dielectric layer on a surface of a substrate of a semiconductor wafer. Then, a surface treatment is performed on the low k dielectric layer to form a passivation layer on a surface of the low k dielectric layer. A patterned photoresist layer is formed over the surface of the semiconductor wafer. The patterned photoresist layer is then used as a hard mask to perform an etching process on the low k dielectric layer. Finally, the stripping process is performed to remove the patterned photoresist layer.

The present invention uses a nitrogen containing plasma as a pre-treatment so as to form a passivation layer on the surface of the low k dielectric layer. The passivation layer inhibits the formation of Si—OH bonds in the low k dielectric layer during the stripping process, so effectively avoiding moisture absorption of Si—OH bonds that leads to a deterioration of the low k dielectric layer.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
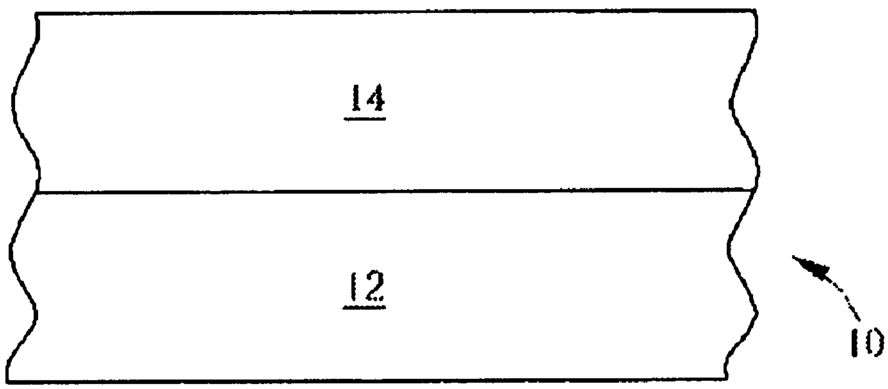
FIG. 1 to FIG. 5 are schematic diagrams of performing an etching process in a low k dielectric layer according to the present invention.

Please refer to FIG. 1 to FIG. 5 of schematic diagrams of performing an etching process in a low k dielectric layer. As shown in FIG. 1, a semiconductor wafer 10 comprises a silicon substrate 12 and a low k dielectric layer 14. The low k dielectric layer 14 is formed on a surface of the silicon substrate 12 utilizing chemical vapor deposition (CVD) or a spin-on method. Wherein, the low k dielectric layer 14 is composed of dielectric materials based on silicon dioxide such as HSQ (hydrogen silsesquioxane) (k=2.8), MSQ (methyl silsesquioxane) (k=2.7), HOSP (k=2.5), H-PSSQ (hydrio polysilsesquioxane), M-PSSQ (methyl polysilsesquioxane), P-PSSQ (phenyl polysilsesquioxane).

Figure 2:
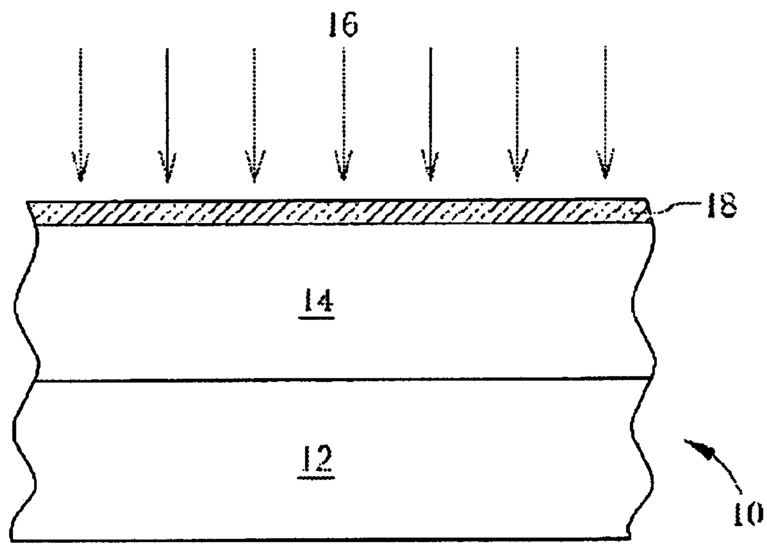

As shown in FIG. 2, a surface treatment 16 is then performed on the low k dielectric layer 14 of the semiconductor wafer 10, under process conditions of having a radio frequency (RF) with a power of about 100 to 300 Watts (W), a process pressure of $10^{-3}$ Torr and a process temperature maintaining the substrate 12 between 150 and 250° C., a nitrogen containing a plasma such as nitrous oxide (N20), nitric oxide (NO) or ammonia, for between 5 and 15 minutes. Thereafter, a passivation layer 18 is formed on a surface of the low k dielectric layer 14. Wherein, the chamber pressure before injecting nitrogen containing plasma is regulated at $10^{-6}$ Torr.

Since the low k dielectric layer 14 comprises silicon and oxygen atoms, a surface of the low k dielectric layer 14 reacts with nitrogen containing plasma to form the passivation layer 18 composed of silicon nitride (SiN) or silicon oxy-nitride (SiON). The passivation layer 18 efficiently prevents moisture absorption in the low k dielectric layer 14. Moreover, the passivation layer 18 can be used as a barrier layer to inhibit copper diffusion. Besides, the passivation layer is only formed on the surface of the low k dielectric layer 14 and its thin thickness does not affect the dielectric constant of the low k dielectric layer 14.

Figure 3:
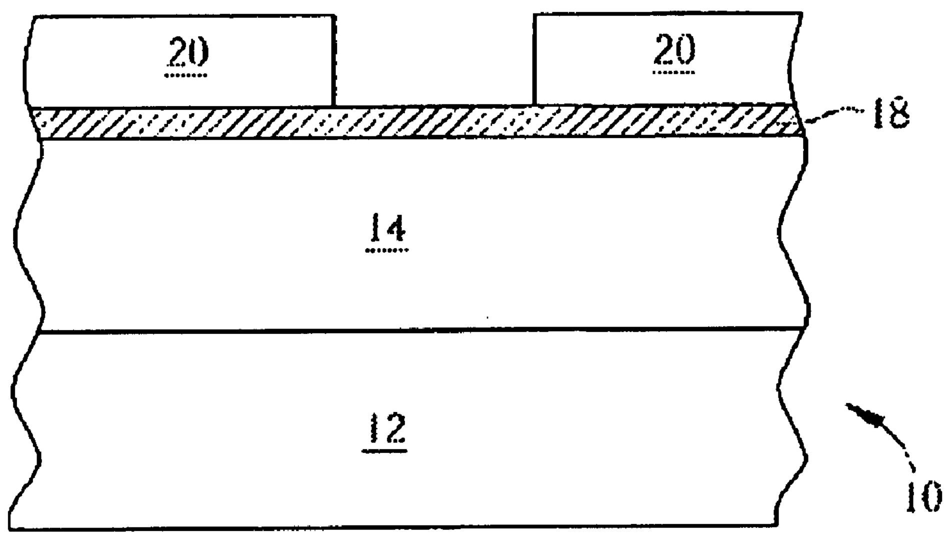
Figure 4:
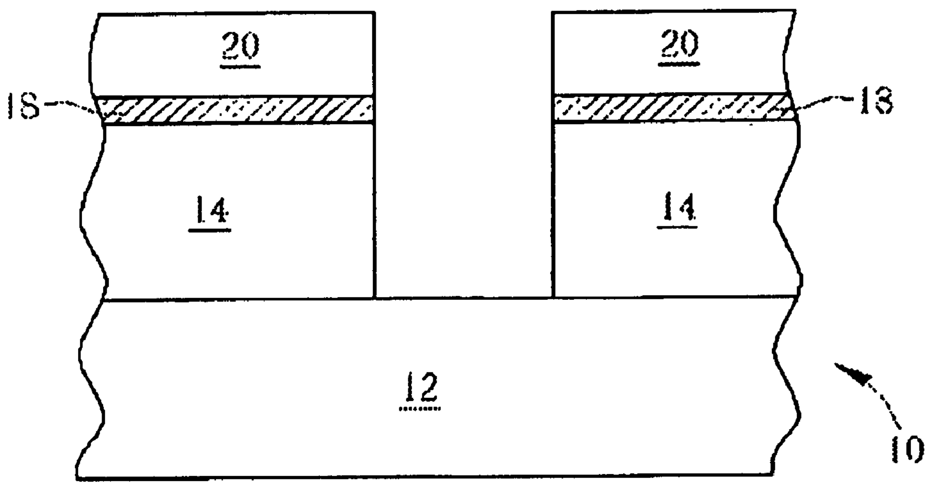
Figure 5:
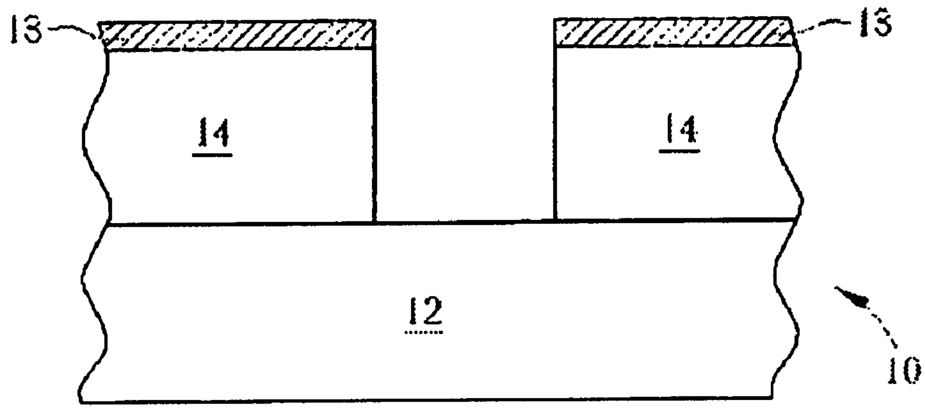

Then, as shown in FIG. 3, a photoresist layer 20 is coated a surface of the semiconductor wafer 10. A lithography process is used to define an etch pattern in the photoresist layer 20. The patterned photoresist layer 20 is then used as a hard mask to etch the low k dielectric layer 14 and the passivation layer 18. Thus, the etch pattern is transferred to the low k dielectric layer 14, as shown in FIG. 4. Finally, a stripping process is performed. That is, a plasma ashing process is used to perform reactive ion etching in the photoresist layer 20. The oxygen plasma reacts with carbon and hydrogen atoms in the photoresist layer 20 to form gaseous carbon dioxide and water vapor so as to strip the photoresist layer 20. Then, the semiconductor wafer 10 is placed in a wet stripper such as hydroxyamineor ethanolamine to remove the photoresist layer 20 remains on a surface of the passivation layer 18, as shown in FIG. 5, and the fabrication process of the present invention is completed. Wherein, due to the formation of the passivation layer 18 on the surface of the low k dielectric layer 14, the low k dielectric layer 14 is not damaged during the stripping process to form moisture absorbing Si—OH bonds. Therefore, the dielectric constant and current leakage of the low k dielectric layer 14 do not increase so that deterioration of the dielectric characteristic of the low k dielectric layer 14 is avoided.

Figure 6:
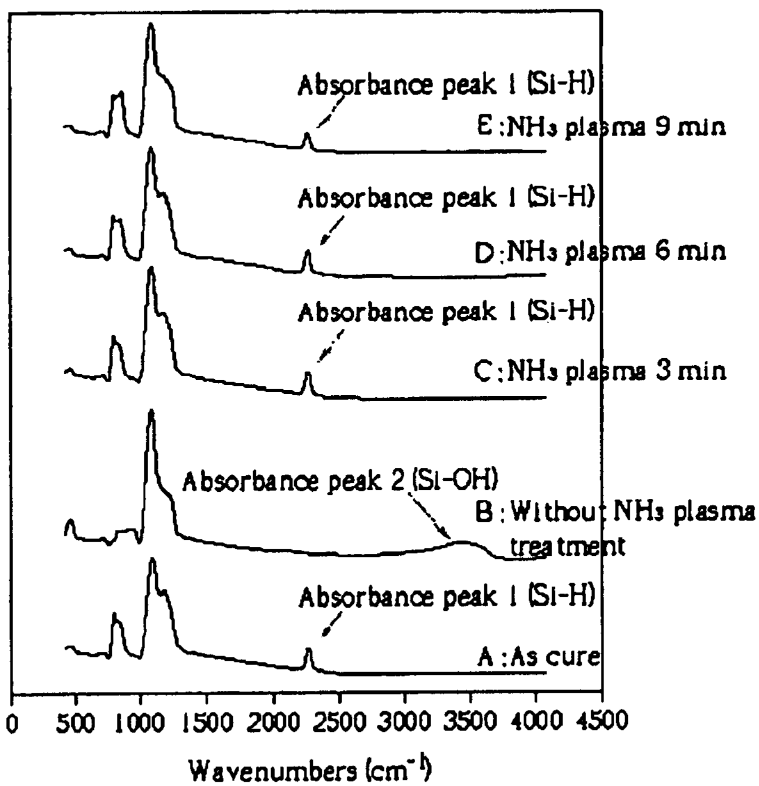
FIG. 6 is an infrared spectroscopy of an HSQ dielectric layer at different process times of performing ammonia plasma.

Please refer to FIG. 6 of an infrared spectroscopy of the HSQ dielectric layer at different process times in the ammonia plasma treatment. Curves A, B respectively represent an infrared spectroscopy of the HSQ dielectric layer before and after the stripping process without performing the ammonia plasma treatment. Curves C, D, and E, respectively represent an infrared spectroscopy of the HSQ dielectric layer performing the ammonia plasma treatment at 3, 6, and 9 minutes before the stripping process. Wherein, the absorption peak 1 and absorption peak 2 respectively represent the absorption of Si—H and Si—OH bonds which absorb infrared waves to 2200–2300 $cm^{-1}$ and 3000–3500 $cm^{-1}$, respectively.

Comparing curve A and curve B, following the HSQ dielectric layer performing stripping process, the peak 1 of the Si—H bond disappears and the Si—OH bonds appear in the HSQ dielectric layer, thus proving that the surface structure of the HSQ dielectric layer is damaged during the stripping process. But in curves C, D, and E, the peak 1 still exists and peak 2 does not appear. This shows that ammonia plasma pretreatment can prevent the Si—H bond from being broken and prevent Si—OH bonds forming during the stripping process. Besides, the absorption of peak 1 obviously decreases as a process time of the ammonia plasma treatment increases. Therefore, less than 20 minutes of plasma treatment is suggested as the Si—H bonds in the dielectric layer become damaged due to a long process time, and the dielectric layer comprises too many nitrogen atoms due to a long process time thus increasing the dielectric constant of the dielectric layer.

Figure 7:
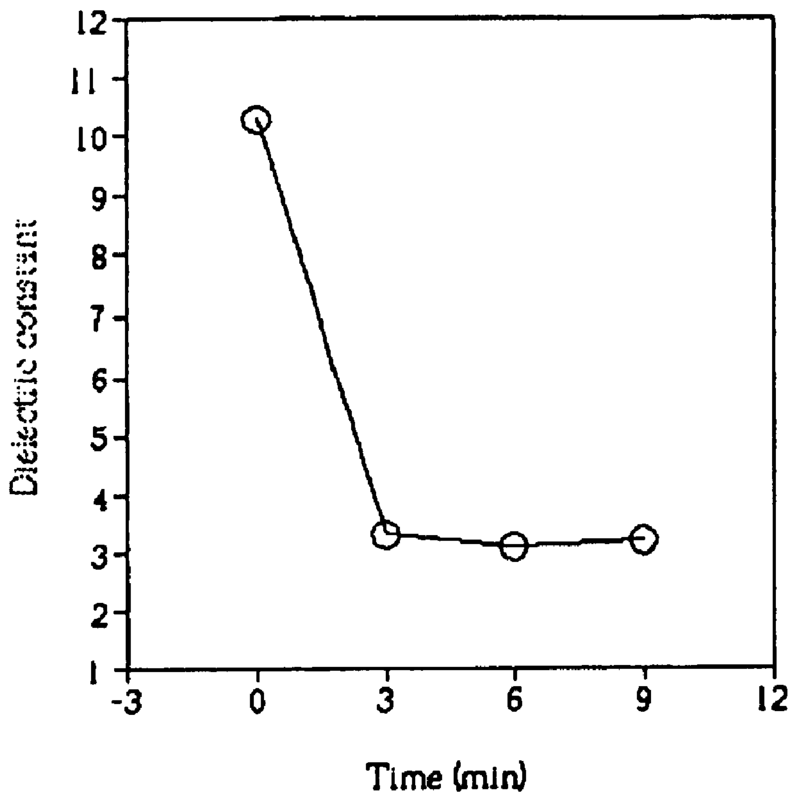
FIG. 7 is a dielectric constant of the HSQ dielectric layer at different process times in performing an ammonia plasma treatment.
Figure 8:
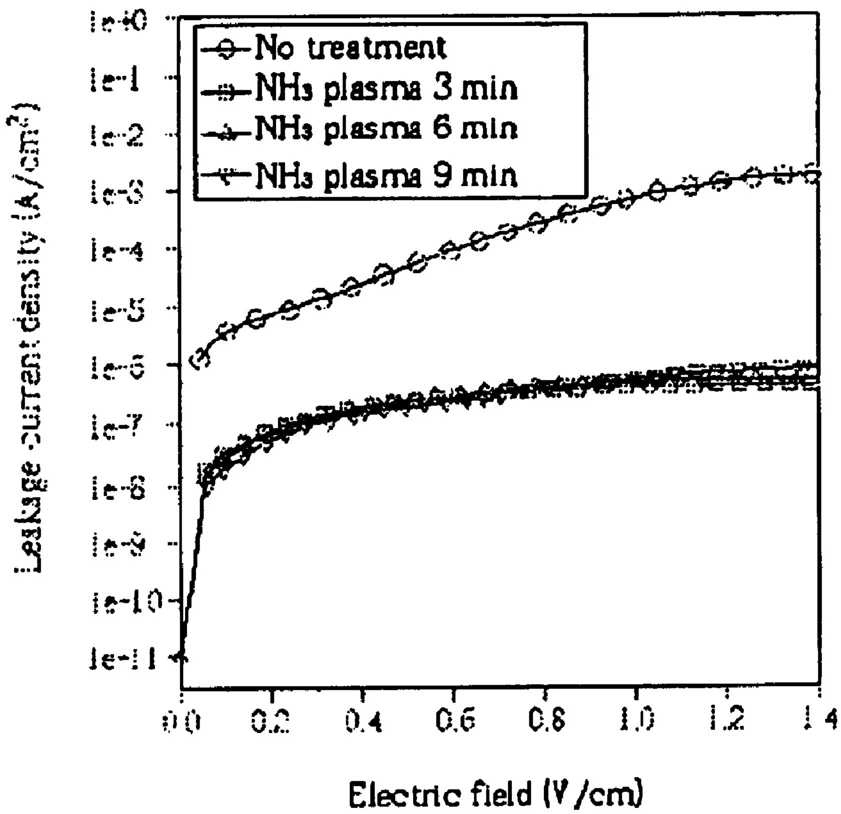
FIG. 8 is a relationship between an electrical field and a current leakage density of the HSQ dielectric layer at different process times in performing the ammonia plasma treatment.

Please refer to FIG. 7 and FIG. 8. FIG. 7 is a chart showing a relationship between the dielectric constant of the HSQ dielectric layer at different process time intervals during the ammonia plasma treatment. FIG. 8 is a relationship between electrical field and current leakage density of the HSQ dielectric layer at different process time intervals during the plasma treatment of ammonia plasma. As shown in FIG. 7, the dielectric constant of the HSQ dielectric layer during the ammonia plasma treatment at times of 3, 6 and 9 minutes respectively is lower than the dielectric constant of the HSQ dielectric without performing the ammonia plasma treatment (0 minutes). When performing ammonia plasma treatment for more than 3 minutes, the dielectric constant value remains constant, showing that an increase in the plasma treatment time does not affect the dielectric constant. FIG. 8 also shows the same result, where square, upward-pointing triangle, downward-pointing triangle represent the relationship of the electric field and the current leakage density in HSQ dielectric layer at 3, 6, and 9 minutes of ammonia plasma pre-treatment. Circle represents the relationship of the electric field and the current leakage density in the HSQ dielectric layer without performing ammonia plasma pre-treatment. As shown in FIG. 8, the current leakage of the dielectric layer undergoing the ammonia plasma treatment (3, 6, 9 min) is greatly reduced by a factor or 100 or 1000 when compared to the dielectric layer that does not undergo ammonia plasma treatment. After ammonia plasma treatment for 3 minutes, increasing the process time of the ammonia plasma treatment does not significantly affect the current leakage, so 3 minutes is chosen as the process time for ammonia plasma treatment for the preferred embodiment of the present invention.

Above all, in order to avoid damage of the low k dielectric layer during the stripping process, the present invention performs the nitrogen containing plasma pre-treatment on the surface of the low k dielectric layer before the etching process, so that the surface of the low k dielectric layer forms a passivation layer. The passivation layer inhibits the oxygen plasma and the wet stripper reacts with the low k dielectric layer during the stripping process so that damage to the low k dielectric layer is avoided during the process. Therefore, the present invention can efficiently prevent Si—OH formation in the low k dielectric layer (as shown in FIG. 6) and solve the problems of dielectric constant and current leakage increase (as shown in FIG. 7 and FIG. 8) resulting in the prior art.

In contrast to the prior art method of etching a silicon dioxide based low k dielectric layer, the present invention uses a nitrogen containing plasma to perform a surface treatment on a surface of the low dielectric layer so as to inhibit Si—OH formation in the low k dielectric layer during a subsequent stripping process. Therefore, problems in the dielectric constant and current leakage increase caused by the prior art are solved so as to improve the yield of the semiconductor wafer.

Those skilled in the art will readily observe that numerous modifications and alterations of the device may be made while retaining the teachings of the invention.

Accordingly, the above disclosure should be construed as limited only by the metes and bounds of the appended claims.

What is claimed is:

1. A method for avoiding deterioration of a dielectric characteristic of a dielectric layer having a low dielectric constant (low k) during a stripping process, the dielectric layer formed on a surface of a substrate, the method comprising:

performing surface treatment to the low k dielectric layer to form a passivation layer on a surface of the low k dielectric layer;

forming a patterned photoresist layer over the substrate;

using the photoresist layer as a hard mask to perform an etching process on the low k dielectric layer; and performing a stripping process.

2. The method of claim 1 wherein the substrate is a silicon substrate provided by a silicon wafer.

3. The method of claim 1 wherein the low k dielectric layer is composed of HSQ (hydrogen silsesquioxane), MSQ (methyl silsesquioxane), H-PSSQ (hydrio polysilsesquioxane), M-PSSQ (methyl polysilsesquioxane), P-PSSQ (phenyl polysilsesquioxane) or HOSP.

4. The method of claim 3 wherein the low k material is formed on the substrate by performing a chemical vapor deposition (CVD) process or a spin-on process.

5. The method of claim 1 wherein the surface treatment is a plasma treatment.

6. The method of claim 5 wherein the plasma treatment is performed in a nitrogen-containing environment to form the passivation layer on the surface of the low k dielectric layer.

7. The method of claim 6 wherein the nitrogen-containing environment comprises nitrous oxide ($N_2O$), nitric oxide (NO), or ammonia ($NH_3$).

8. The method of claim 6 wherein the plasma treatment utilizes a radio frequency (RF) with a power of about 100 to 300 Watts (W), a process pressure between $10^{-3}$ and $10^{-6}$ Torr, a process time of less than 20 minutes, and a process temperature of the substrate that is less than 250° C.

9. The method of claim 1 wherein the stripping process is a wet stripping process, and the passivation layer is used to avoid formation of Si—OH bonds in the low k dielectric layer during the wet stripping process.

10. A method for avoiding deterioration of a dielectric characteristic of a low k dielectric layer, the low k dielectric layer formed on a substrate, the method comprising:

performing a surface treatment to the low k dielectric layer to form a passivation layer on a surface of the low k dielectric layer;

forming a patterned photoresist layer over the substrate;

using the photoresist layer as a hard mask to perform an etching process to the low k dielectric layer; and performing a wet stripping process;

wherein the passivation layer is used to inhibit the formation of Si—OH bonds that absorb moisture in the low k dielectric layer during the wet stripping process to avoid deterioration of dielectric characteristics of the low k dielectric layer.

11. The method of claim 10 wherein the substrate is silicon substrate provided by a silicon wafer.

12. The method of claim 10 wherein the low k dielectric layer is composed of HSQ hydrogen, MSQ, H-PSSQ, M-PSSQ, P-PSSQ or HOSP.

13. The method of claim 12 wherein the low k material is formed on the substrate by performing a chemical vapor deposition (CVD) process or a spin-on process.

14. The method of claim 10 wherein the surface treatment is a plasma treatment.

15. The method of claim 14 wherein the plasma treatment is performed in a nitrogen-containing environment to form the passivation layer on the surface of the low k dielectric layer.

16. The method of claim 15 wherein the nitrogen-containing environment comprises nitrous oxide ($N_2O$), nitric oxide (NO), or ammonia ($NH_3$).

17. The method of claim 16 wherein the plasma treatment utilizes a radio frequency (RF) of the plasma treatment having a power of about 100 to 300 Watts (W), a process pressure that is between $10^{-3}$–$10^{-6}$ Torr, a process time that is less than 20 minutes, and a process temperature of the substrate that is less than 250° C.

* * * * *